United States Patent
Pan et al.

(10) Patent No.: US 10,886,122 B2
(45) Date of Patent: *Jan. 5, 2021

(54) METHODS FOR CONFORMAL TREATMENT OF DIELECTRIC FILMS WITH LOW THERMAL BUDGET

(71) Applicant: APPLIED MATERIALS, INC., Santa Clara, CA (US)

(72) Inventors: Heng Pan, Santa Clara, CA (US); Matthew Scott Rogers, Mountain View, CA (US); Christopher S. Olsen, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/650,469

(22) Filed: Jul. 14, 2017

(65) Prior Publication Data
US 2017/0316930 A1   Nov. 2, 2017

Related U.S. Application Data

(63) Continuation of application No. 14/206,766, filed on Mar. 12, 2014, now Pat. No. 9,728,401.

(60) Provisional application No. 61/787,584, filed on Mar. 15, 2013.

(51) Int. Cl.
*H01L 21/02* (2006.01)
*H01L 21/67* (2006.01)
*H01J 37/32* (2006.01)

(52) U.S. Cl.
CPC .... *H01L 21/0234* (2013.01); *H01J 37/32357* (2013.01); *H01J 37/32724* (2013.01); *H01L 21/67115* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 6,133,086 | A * | 10/2000 | Huang | H01L 21/31604 257/310 |
| 6,818,517 | B1 | 11/2004 | Maes | |
| 7,910,497 | B2 * | 3/2011 | Olsen | C23C 16/0272 257/E21.143 |
| 9,728,401 | B2 * | 8/2017 | Pan | H01L 21/0234 |
| 2005/0221618 | A1 | 10/2005 | AmRhein et al. | |
| 2010/0255661 | A1 | 10/2010 | Vatus et al. | |
| 2012/0056862 | A1 * | 3/2012 | Yamazaki | G09G 3/2077 345/207 |
| 2012/0088356 | A1 | 4/2012 | Santhanam et al. | |
| 2014/0273518 | A1 | 9/2014 | Rogers et al. | |

* cited by examiner

*Primary Examiner* — Alexander G Ghyka
(74) *Attorney, Agent, or Firm* — Moser Taboada

(57) ABSTRACT

Embodiments of methods for treating dielectric layers are provided herein. In some embodiments, a method of treating a dielectric layer disposed on a substrate supported in a process chamber includes: (a) exposing the dielectric layer to an active radical species formed in a plasma for a first period of time; (b) heating the dielectric layer to a peak temperature of about 900 degrees Celsius to about 1200 degrees Celsius; and (c) maintaining the peak temperature for a second period of time of about 1 second to about 20 seconds.

18 Claims, 3 Drawing Sheets

METHODS FOR CONFORMAL TREATMENT OF DIELECTRIC FILMS WITH LOW THERMAL BUDGET

CROSS-REFERENCE TO RELATED APPLICATIONS

This application is a continuation of co-pending U.S. patent application Ser. No. 14/206,766, filed Mar. 12, 2014 which also claims the benefit of U.S. provisional patent application Ser. No. 61/787,584, filed Mar. 15, 2013, which is herein incorporated by reference in its entirety.

FIELD

Embodiments of the present invention generally relate to methods of processing substrates. More specifically, embodiments of the present invention provide improved methods of treating dielectric films with a low thermal budget.

BACKGROUND

A dielectric layer, such as an oxide layer, may be utilized in semiconductor devices, photovoltaic cells, light emitting diodes (LEDs) or the like as an insulating layer. Accordingly, dielectric layers are required to have, for example, suitable dielectric properties and layer quality to prevent leakage between conducting layers, such as between the channel and gate of a transistor device and to reduce interfacial and bulk defects. Following its formation, a dielectric layer can be treated to improve its dielectric properties and layer quality, for example, by rapid thermal processing (RTP) which subjects a substrate to brief intense bursts of heat. RTP technology can be used to change the characteristics of a deposited film layer or crystal lattice and generally includes processing such as annealing, silicidation, and oxidation of a substrate surface. Typically, dielectric layers treated at high temperatures exhibit suitable dielectric properties and layer quality. Unfortunately, reduced thermal budgets make high temperature treatment processes unsuitable for many applications.

Accordingly, the inventors have provided improved methods of treating dielectric films with a low thermal budget.

SUMMARY

Embodiments of methods for treating dielectric layers are provided herein. In some embodiments, a method of treating a dielectric layer disposed on a substrate supported in a process chamber includes: (a) exposing the dielectric layer to an active radical species formed in a plasma for a first period of time; (b) heating the dielectric layer to a peak temperature of about 900 degrees Celsius to about 1200 degrees Celsius; and (c) maintaining the peak temperature for a second period of time of about 1 second to about 20 seconds.

In some embodiments, a method of treating a dielectric layer disposed on a substrate supported in a process chamber includes: (a) exposing the dielectric layer to an active radical species formed using a remote plasma source for a first period of time of about 1 to about 200 seconds; (b) heating the dielectric layer to a peak temperature of about 900 degrees Celsius to about 1200 degrees Celsius; and (c) maintaining the peak temperature for a second period of time of about 1 second to about 20 seconds.

In some embodiments, a method of treating a dielectric layer disposed on a substrate supported in a process chamber includes (a) exposing the dielectric layer to an active radical species formed using a remote plasma source for a first period of time of about 1 to about 200 seconds; (b) heating the dielectric layer to a peak temperature of about 900 degrees Celsius to about 1200 degrees Celsius in a spike anneal process; and (c) maintaining the peak temperature for a second period of time of less than about 2 seconds.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
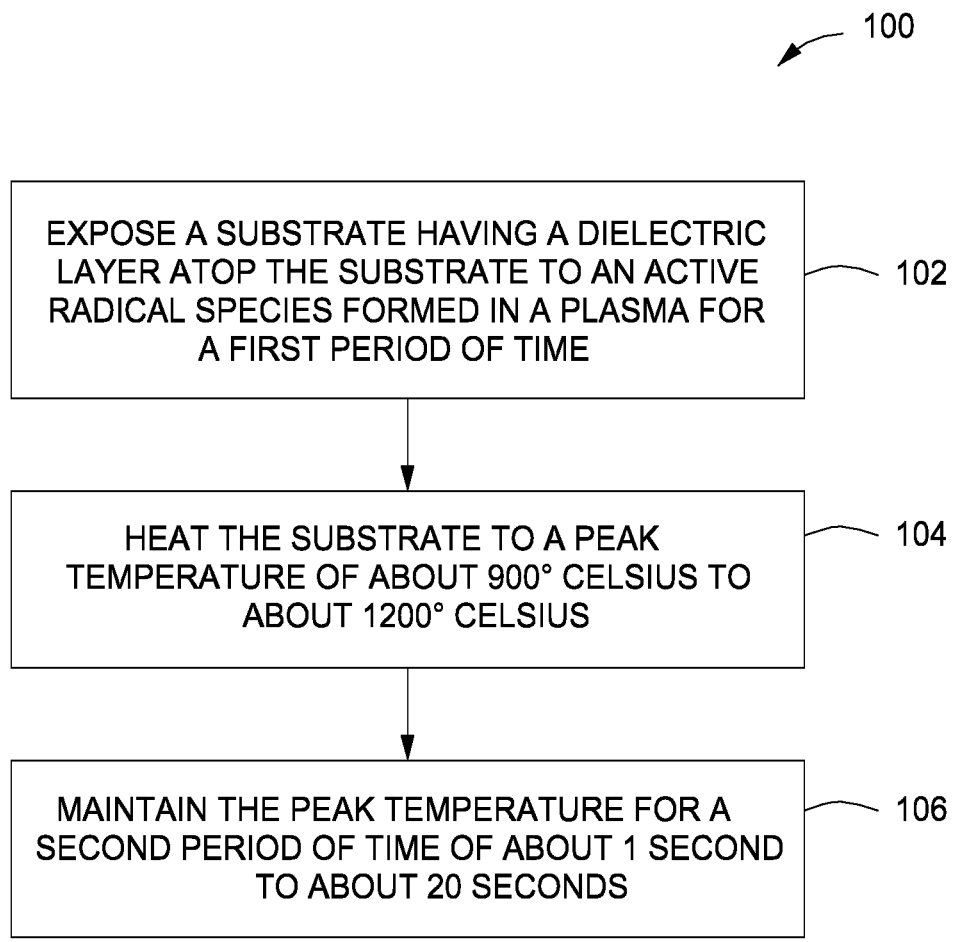
FIG. 1 depicts a flow chart of a method of processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of processing substrates are provided herein. Embodiments of the present invention may advantageously facilitate improved dielectric properties and dielectric layer quality at a reduced thermal budget, thereby limiting diffusion effects by reducing the exposure time of the substrate to a rapid thermal processing process as compared to conventional high temperature annealing processes.

FIG. 1 depicts a flow chart of a method 100 of processing a substrate having a dielectric layer formed thereon in accordance with some embodiments of the present invention. In some embodiments, the substrate may be a substrate as used in the fabrication of semiconductor devices, solar and photovoltaic cells, LED, OLED, digital displays, or the like, and may have various dimensions, such as 200, 300, or 450 mm diameter semiconductor wafers, rectangular or square panels, or the like. The substrate may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or other suitable substrate upon which a dielectric layer is formed.

The dielectric layer may be any suitable dielectric layer utilized with semiconductor devices. For example, in some embodiments, the dielectric layer can be any suitable oxide layer utilized with semiconductor devices. For example, the oxide layer may be a high-k dielectric layer forming the gate oxide of a logic device such as a metal oxide semiconductor field effect transistor (MOSFET) or tunnel oxide or IPD layers in a Flash memory device, or a high-k dielectric layer disposed between the electrodes of a DRAM capacitor, or the like. Exemplary materials forming the oxide layer may include hafnium oxide ($HfO_2$), hafnium silicon oxide ($HfSiO_x$), hafnium silicon oxynitride ($HfSiO_xN_y$), aluminum oxide ($Al_2O_3$), silicon oxide ($SiO_2$), silicon oxynitride (SiON), and the like. The oxide layer may be formed using any suitable oxidation process, for example, thermal oxidation, low pressure chemical vapor deposition (LPCVD), atomic layer deposition (ALD), plasma enhanced chemical vapor deposition (PECVD), or combinations thereof.

The method 100 begins at 102 by exposing the substrate having the dielectric layer formed on the substrate to an active radical species formed in a plasma for a first period of time from about 1 second to about 200 seconds. In some embodiments, the plasma may be formed from a process gas including an oxygen-containing gas. In some embodiments, the plasma may be formed from a process gas including a nitrogen-containing gas. In some embodiments, the plasma may be formed from a process gas including a combination of an oxygen-containing gas and a nitrogen-containing gas, for example a process gas containing a mixture of about 20 percent nitrogen and the balance oxygen. In some embodiments, the process gas may include one or more of oxygen ($O_2$), ozone ($O_3$), water vapor ($H_2O$), nitrous oxide ($N_2O$), nitric oxide (NO), hydrogen ($H_2$), argon (Ar) or helium (He).

In some embodiments, the first process gas may be ignited using an RF power source, for example an RF power source providing about 50 watts to about 2000 watts of RF power at a frequency of about 0.05 MHz to about 13.56 MHz. In some embodiments, the first process gas may be ignited using a high density power source, for example a microwave power source providing 50 watts to 5000 watts at a frequency of 915 MHz or 2.45 GHz. In some embodiments, the plasma is formed using a remote plasma source coupled to the substrate processing chamber. The inventors have observed that the presence of active radical species in the remote plasma advantageously improves the conformality of the treatment of the dielectric layer. In some embodiments, the plasma is formed from the process gas using a remote plasma source at a substrate temperature of less than about 800 degrees Celsius. In some embodiments, the plasma is formed from the process gas using a remote plasma source at a substrate temperature of less than about 500 degrees Celsius.

Next at 104, the substrate is heated to a peak temperature of about 900 degrees Celsius to about 1,200 degrees Celsius. At 106, the peak temperature is maintained for a second period of time of about 1 second to about 20 seconds. For example, the substrate may be heated by a thermal process, such as a rapid thermal process (RTP). One exemplary RTP is a spike rapid thermal anneal (spike anneal). A spike anneal is performed by subjecting a substrate to temperature treatment in a RTP system, such as described below. The peak temperature and the amount of time the substrate is maintained at the peak temperature may be selected to provide a low thermal budget process. For example, in some embodiments, the substrate is spike annealed to a peak temperature of about 1,200 degrees Celsius for less than about 2 seconds, which is considered a low thermal budget process. In some embodiments, the substrate is spike annealed to a peak temperature of about 1,100 degrees Celsius for about 1.6 seconds, which is considered a low thermal budget process. Maintaining a low thermal budget process is beneficial, for example, in limiting dopant redistribution during activation, which can impact device performance.

In some embodiments, such as during a spike anneal, the substrate may be heated to the peak temperature at a first heating rate. In some embodiments, the first heating rate may be about 75 degrees Celsius per second to about 200 degrees Celsius per second. In some embodiments, for example, during a spike anneal, it may be desired to maximize the heating rate, such that the substrate reaches the peak temperature quickly. Maximizing the heating rate may, for example, contribute to reducing the period of time that the substrate spends at or proximate the peak temperature.

A typical annealing profile using a spike anneal may involve ramping the temperature of the substrate up to a peak temperature, soaking the substrate at the peak temperature for a period of time, and ramping down to a base temperature. In some embodiments, the substrate is cooled down to a base temperature of about 500 degrees Celsius to about 800 degrees Celsius within about 2 seconds to about 20 seconds.

In some embodiments, the substrate can be exposed to the remote plasma while spike annealing the substrate. In some embodiments, the exposure of the substrate to the plasma is terminated prior to annealing the substrate. In some embodiments, the substrate, or the dielectric layer, can be pre-heated prior to exposing the substrate to a plasma and spike annealing the substrate. In some embodiments, the substrate can be pre-heated to a peak temperature of about 400 degrees Celsius to about 800 degrees Celsius for about 1 second to about 200 seconds.

Figure 2:
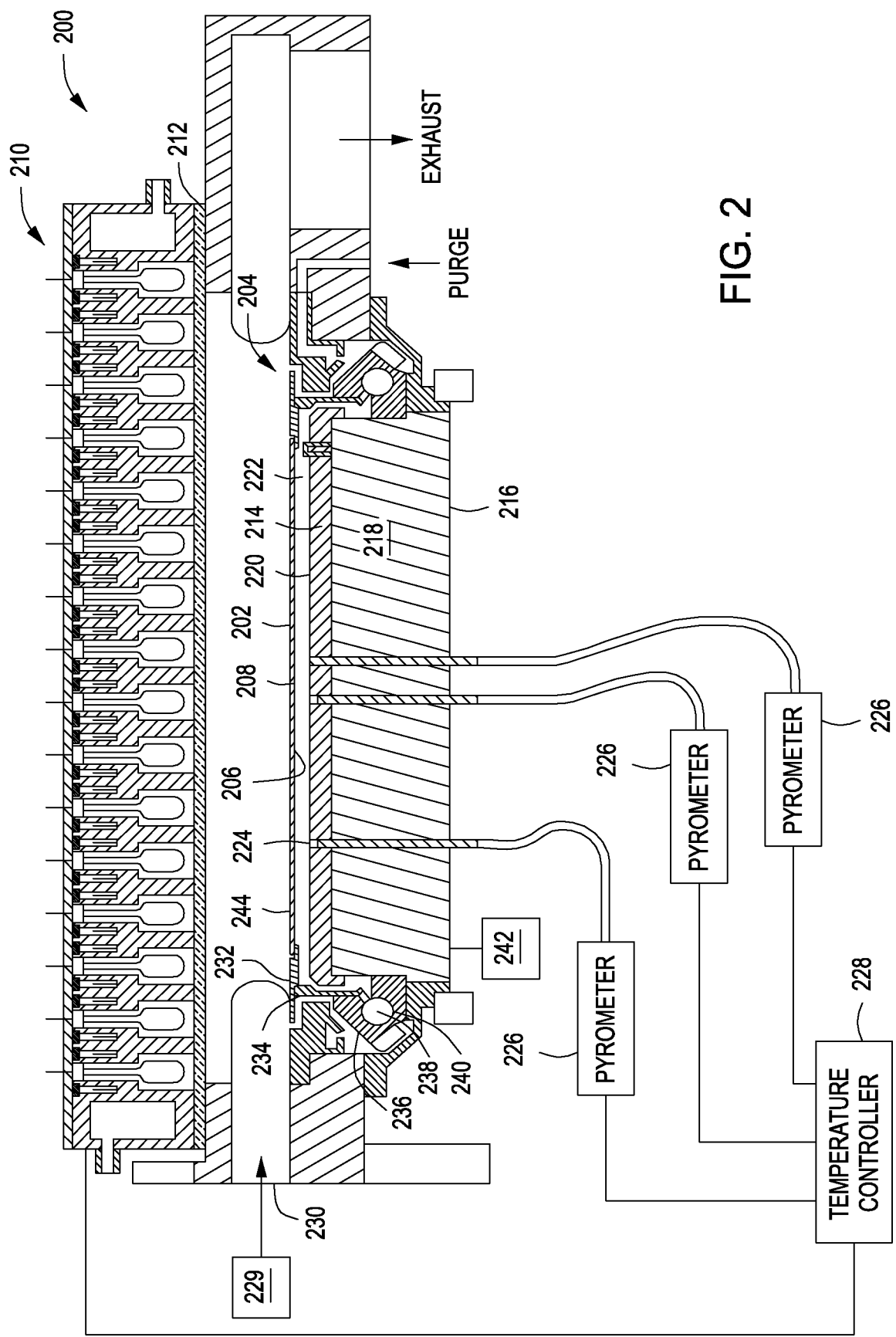
FIG. 2 depicts a schematic cross-sectional view of a process chamber in accordance with some embodiments of the present invention.

The process chamber suitable for performing the inventive method 100 may be any type of process chamber configured to perform a rapid thermal processing process. Examples of process chambers suitable for performing the inventive method include any of the RADIANCE®, RADIANCE® PLUS, or VANTAGE® process chambers, or any other process chamber capable of performing a thermal process, for example a rapid thermal process (RTP), all available from Applied Materials, Inc., of Santa Clara, Calif. In some embodiments, the process chamber may be similar to the process chamber 200 described below with respect to FIG. 2.

The substrate 202, having a dielectric layer 244 disposed thereon, is mounted inside the process chamber 200 on a substrate support 204 and is heated by the lamp head 210, which is disposed in a position opposing the substrate support 204. The lamp head 210 generates radiation which is directed to a front side 208 of the substrate 202. Alternatively (not shown), the lamp head 210 may be configured to heat the back side 206 of the substrate 202, for example, such as by being disposed below the substrate 202, or by directing the radiation to the back side 206 of the substrate 202. The radiation enters the process chamber 200 through a water-cooled quartz window assembly 212. Beneath the substrate 202 is a reflector plate 214, which is mounted on a water-cooled, stainless steel base 216. The base 216 includes a circulation circuit 218 through which coolant circulate to cool the reflector plate 214. In some embodiments, the reflector plate 214 is made of aluminum and has a highly reflective surface coating 220. Water may be circulated through the base 216 to keep the temperature of the reflector plate 214 well below that of the heated substrate 202. Alternatively, other coolants may be provided at the same or different temperatures. For example, antifreeze (e.g., ethylene glycol, propylene glycol, or the like) or other heat transfer fluids may be circulated through the base 216 and/or the base 216 may be coupled to a chiller (not shown). An underside or back side of the substrate 202 and the top of the reflector plate 214 form a reflecting cavity 222. The reflecting cavity 222 enhances the effective emissivity of the substrate 202.

The temperatures at localized regions of the substrate 202 are measured by a plurality of temperature probes 224 coupled to a plurality of pyrometers 226. The plurality of pyrometers 226 is connected to a temperature controller 228 which controls the power supplied to the lamp head 210 in response to a measured temperature. The lamps may be divided into multiple zones. The zones can be individually adjusted by the controller to allow controlled radiative heating of different areas of the substrate 202.

During processing, a first gas may be flowed from a gas panel (e.g., gas supply 229) and enter the process chamber 200 at an inlet 230 (e.g., a first inlet). For example, in some embodiments, the gas supply 229 may be a remote plasma source (e.g., a remote plasma chamber) to form a plasma from the first gas prior to providing the plasma to the process chamber. The inlet 230 is disposed in a side of the process chamber 200 and facilitates the flow of the first gas across the surface of the substrate 202.

The substrate support 204 may be configured to be stationary or may rotate the substrate 202. The substrate support 204 includes a support ring 232 which contacts the substrate 202 around the outer perimeter of the substrate, thereby leaving the entire underside of the substrate 202 exposed except for a small annular region about the outer perimeter. To minimize the thermal discontinuities that may occur at the edge of the substrate 202 during processing, the support ring 232 may be made of the same, or similar, material as that of the substrate 202, for example, silicon.

In some embodiments, the support ring 232 may rest on a rotatable tubular cylinder 234 that is coated with silicon to render it opaque in the frequency range of the pyrometer 226. The coating on the cylinder 234 acts as a baffle to block out radiation from the external sources that might contaminate the intensity measurements. The bottom of the cylinder 234 is held by an annular upper bearing 236 which rests on a plurality of ball bearings 238 that are, in turn, held within a stationary, annular, lower bearing race 240. In some embodiments, the ball bearings 238 are made of steel and coated with silicon nitride to reduce particulate formation during operations. The upper bearing 236 is magnetically coupled to an actuator (not shown) which rotates the cylinder 234, the support ring 232 and the substrate 202 during processing.

The substrate support 204 may be coupled to a lift mechanism 242 capable of raising and lowering the substrate 202 with respect to the lamp head 210. For example, the substrate support 204 may be coupled to the lift mechanism 242, such that a distance between the substrate 202 and the reflector plate 214 is constant during the lifting motion.

Figure 3:
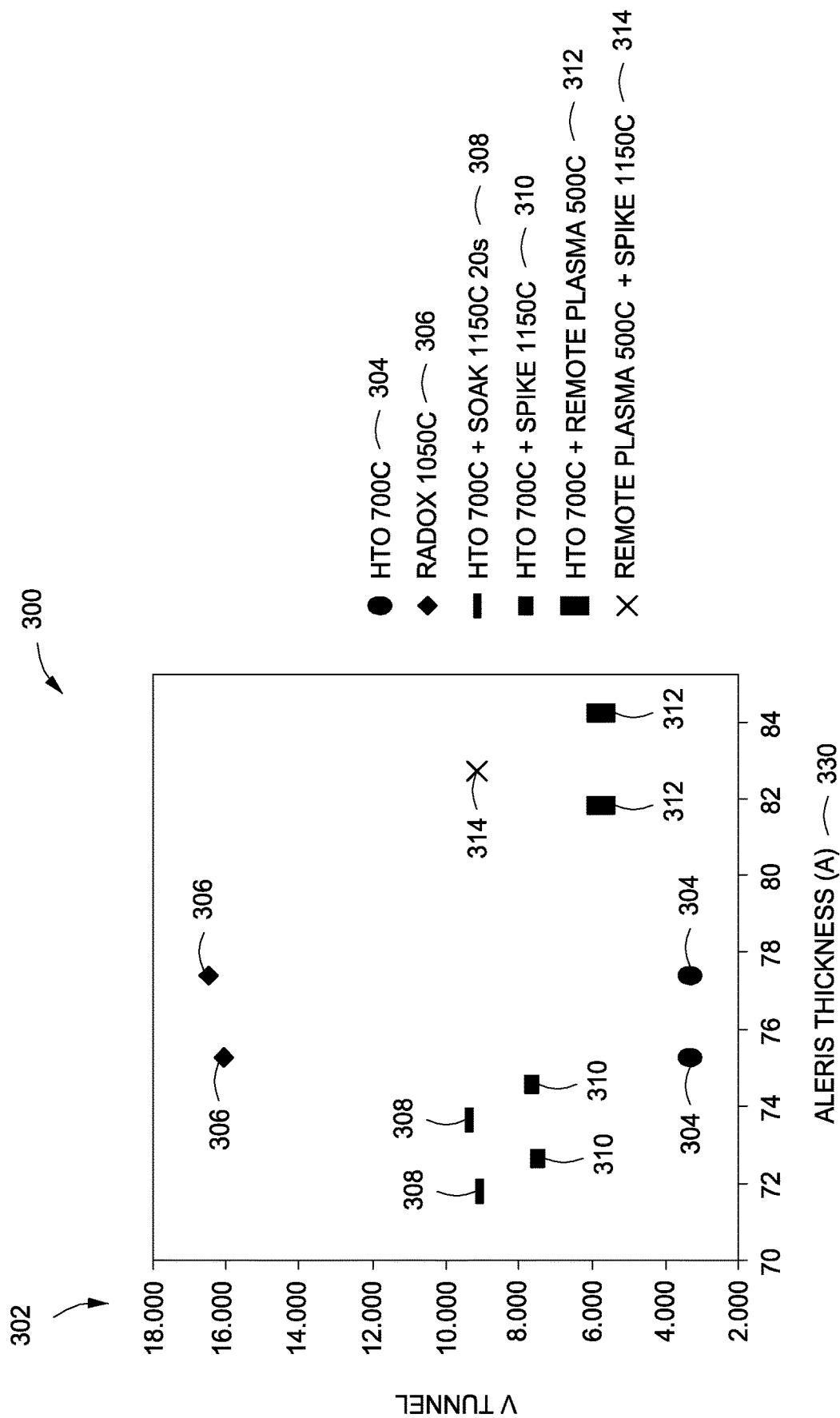
FIG. 3 depicts a graph plotting the leakage ("V-tunnel value") of a dielectric layer versus the thickness of the dielectric layer in accordance with some embodiments of the present invention.

The inventors have discovered that exposing dielectric films to a plasma treatment and a spike anneal as described herein can advantageously improve the insulating properties of the dielectric film. FIG. 3 depicts a graph 300 plotting the leakage ("V-tunnel value") 302 of a dielectric layer versus the thickness 330 of the dielectric layer in order show the effects of remote plasma treatment and spike anneal on a substrate having a dielectric layer. The data presented in FIG. 3 is provided to illustrate embodiments of the present invention and is not meant to be limiting of the scope of the invention. The lower the value of the V-tunnel 302 on the graph 300, the greater the leakage between conducting layers allowed by the dielectric layer.

As depicted in the graph 300, a first dielectric layer 304 representing an untreated dielectric layer has a V-tunnel 302 value of about 3, indicating poor insulating properties. While a second dielectric layer 306 representing a thermally grown dielectric film 306 has a V-tunnel value 302 of about 16, indicating good insulating properties; the high temperature treatment process is unsuitable for meeting reduced thermal budgets requirements. A third dielectric layer 308, thermally annealed at 1,150 degrees Celsius for about 20 seconds, has a V-tunnel value 302 of about 9. However, the annealing process at 1,150 degrees Celsius for about 20 seconds is a high thermal budget process. A fourth dielectric layer 310, treated using only a spike anneal at 1,150 degrees Celsius for less than about 2 seconds, has a V-tunnel value 302 of about 7. A fifth dielectric layer 312, treated using only a remote plasma process, has a V-tunnel value 302 of about 6. The sixth dielectric layer 314, treated with a remote plasma and a spike anneal at 1,150 degrees Celsius for less than about 2 seconds as described in the method 100 above, has a V-tunnel value 302 of about 9. As seen from the graph 300, the sixth dielectric layer 314, treated using the method 100 described above, advantageously provides a dielectric layer with greater V-tunnel value than dielectric layers treated by only a remote plasma or only a spike anneal and advantageously provides a dielectric layer at a low thermal budget with a V-tunnel value equivalent to a high thermal budget process.

While the foregoing is directed to embodiments of the present invention, other and further embodiments of the invention may be devised without departing from the basic scope thereof.

The invention claimed is:

1. A method of treating a dielectric layer disposed on a substrate supported in a process chamber, comprising:
    (a) directly exposing the dielectric layer to an active radical species formed in a plasma for a first period of time while the substrate is maintained at a temperature of 500 to 800 degrees Celsius, wherein the dielectric layer is a silicon oxide layer;
    (b) heating the dielectric layer to a peak temperature of about 900 degrees Celsius to about 1200 degrees Celsius; and
    (c) maintaining the peak temperature for a second period of time of about 1 second to about 20 seconds.

2. The method of claim 1, wherein exposing the dielectric layer to the active radical species formed in the plasma further comprises forming the plasma from a process gas using a remote plasma source and providing the plasma to the process chamber.

3. The method of claim 2, wherein the process gas comprises nitrogen ($N_2$), oxygen ($O_2$), argon (Ar), helium (He), hydrogen ($H_2$), or a combination thereof.

4. The method of claim 3, wherein the process gas comprises a mixture of about 20 percent nitrogen with the balance being oxygen.

5. The method of claim 2, wherein the remote plasma source provides about 50 watts to about 5,000 watts of an RF power or a microwave power.

6. The method of claim 1, wherein heating the dielectric layer comprises performing a spike anneal on the substrate.

7. The method of claim 6, wherein the peak temperature of the spike anneal is about 1200 degrees Celsius.

8. The method of claim 7, wherein the second period of time is less than about 2 seconds.

9. The method of claim 6, further comprising exposing the dielectric layer to the active radical species while annealing the substrate.

10. The method of claim 6, further comprising terminating exposure of the dielectric layer to the active radical species prior to annealing the substrate.

11. The method of claim 1, further comprising pre-heating the dielectric layer prior to exposing the dielectric layer to the active radical species.

12. The method of claim 11, further comprising pre-heating the dielectric layer to a peak temperature of about 400 degrees Celsius to about 800 degrees Celsius and maintaining the peak temperature for about 1 second to about 200 seconds prior to performing (a)-(c).

13. The method of claim 1, wherein the first period of time is about 1 second to about 200 seconds.

14. The method of claim 1, further comprising cooling the dielectric layer to a temperature of about 500 degrees Celsius to about 800 degrees Celsius within about 2 seconds to about 20 seconds after the second period of time.

15. The method of claim 1, further comprising heating the dielectric layer to the peak temperature at a first heating rate of about 75 to about 200 degrees Celsius per second.

16. A method of treating a dielectric layer disposed on a substrate supported in a process chamber, comprising:
   (a) directly exposing the dielectric layer to an active radical species formed using a plasma for a first period of time while the substrate is maintained at a temperature between 500 to 800 degrees Celsius, wherein the dielectric layer is silicon oxide;
   (b) heating the dielectric layer to a peak temperature of about 900 degrees Celsius to about 1200 degrees Celsius; and
   (c) maintaining the peak temperature for a second period of time of about 1 second to about 20 seconds.

17. A method of treating a dielectric layer disposed on a substrate supported in a process chamber, comprising:
   (a) directly exposing the dielectric layer to an active radical species formed using a remote plasma source for a first period of time while the substrate is maintained at a temperature of 500 to 800 degrees Celsius, wherein the dielectric layer is a silicon oxide layer,
   (b) subsequently heating the dielectric layer to a peak temperature of about 900 degrees Celsius to about 1200 degrees Celsius in a spike anneal process at a first heating rate of about 75 to about 200 degrees Celsius per second; and
   (c) maintaining the peak temperature for a second period of time of about 1 second to about 20 seconds.

18. The method of claim 1, wherein exposing the dielectric layer to the active radical species comprises exposing the dielectric layer to active radical species from a plasma formed from a process gas including a combination of an oxygen-containing gas and a nitrogen-containing gas.

* * * * *